US012641901B2

(12) United States Patent
Pang et al.

(10) Patent No.: US 12,641,901 B2
(45) Date of Patent: May 26, 2026

(54) HALF QUAD PHOTODIODE (QPD) TO IMPROVE QPD CHANNEL IMBALANCE

(71) Applicant: OMNIVISION TECHNOLOGIES, INC., Santa Clara, CA (US)

(72) Inventors: Chin Poh Pang, Pleasanton, CA (US); Wei Deng, Sunnyvale, CA (US); Chen-Wei Lu, San Jose, CA (US); Da Meng, Fremont, CA (US); Guansong Liu, San Jose, CA (US); Yin Qian, Milpitas, CA (US); Xiaodong Yang, San Jose, CA (US); Hongjun Li, San Jose, CA (US); Zhiqiang Lin, Fremont, CA (US); Chao Niu, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 433 days.

(21) Appl. No.: 17/832,399

(22) Filed: Jun. 3, 2022

(65) Prior Publication Data

US 2023/0395628 A1     Dec. 7, 2023

(51) Int. Cl.
H10F 39/00        (2025.01)
H10F 39/18        (2025.01)

(52) U.S. Cl.
CPC ....... H10F 39/8063 (2025.01); H10F 39/182 (2025.01); H10F 39/8053 (2025.01); H10F 39/8023 (2025.01)

(58) Field of Classification Search
CPC ......... H01L 27/14627; H01L 27/14645; H01L 27/14605; H01L 27/14621;
(Continued)

(56) References Cited

U.S. PATENT DOCUMENTS 8,817,164 B2 * 8/2014 Tayanaka ............. H04N 25/778
                                                        348/340
9,485,442 B1    11/2016 Li et al.
(Continued)

FOREIGN PATENT DOCUMENTS

CN        102483510 A      5/2012
CN        110392192 A     10/2019
(Continued)

OTHER PUBLICATIONS

Office Action dated Jun. 6, 2025 received for U.S. Appl. No. 17/832,335, filed Jun. 3, 2022; 18 pages total.
(Continued)

*Primary Examiner* — Jennifer D Bennett
*Assistant Examiner* — Erin R Garber
(74) *Attorney, Agent, or Firm* — Christensen O'Connor Johnson Kindness PLLC

(57)                ABSTRACT

Half Quad Photodiode (QPD) for improving QPD channel imbalance. In one embodiment, an image sensor includes a plurality of pixels arranged in rows and columns of a pixel array that is disposed in a semiconductor material. Each pixel includes a plurality of subpixels. Each subpixel comprises a plurality of first photodiodes, a plurality of second photodiodes and a plurality of third photodiodes. The plurality of pixels are configured to receive incoming light through an illuminated surface of the semiconductor material. A plurality of small microlenses are individually distributed over individual first photodiodes and individual second photodiodes of each subpixel. A plurality of large microlenses are each distributed over a plurality of third photodiodes of each subpixel. A diameter of the small microlenses is smaller than a diameter of the large microlenses.

19 Claims, 14 Drawing Sheets

(58) Field of Classification Search
    CPC ............. H01L 27/14625; G02B 3/0037; H10F
                39/8063; H10F 39/182; H10F 39/8023;
                H10F 39/8053; H10F 39/806
    See application file for complete search history.

(56)                References Cited

U.S. PATENT DOCUMENTS

| | | | |
|---|---|---|---|
| 9,807,294 B2 | 10/2017 | Liu et al. | |
| 9,838,590 B2 | 12/2017 | Zhang et al. | |
| 11,778,858 B1 * | 10/2023 | Chen ...................... | H10K 59/38 |
| | | | 257/40 |
| 2010/0230583 A1 * | 9/2010 | Nakata .................. | H10F 39/806 |
| | | | 257/E31.127 |
| 2018/0047766 A1 | 2/2018 | Pyo et al. | |
| 2019/0004305 A1 * | 1/2019 | Duckett, III ....... | A61B 1/00096 |
| 2020/0314362 A1 | 10/2020 | Roh et al. | |

| | | | |
|---|---|---|---|
| 2021/0126033 A1 | 4/2021 | Yang et al. | |
| 2022/0132079 A1 | 4/2022 | Choi et al. | |
| 2022/0344389 A1 * | 10/2022 | Pyo ................... | H01L 27/14627 |
| 2024/0204014 A1 * | 6/2024 | Sakamoto .......... | H10F 39/8067 |

FOREIGN PATENT DOCUMENTS

| | | |
|---|---|---|
| CN | 112382640 A | 2/2021 |
| TW | 202136824 A | 6/2021 |

OTHER PUBLICATIONS

1st Office Action and Search Report (with English translation) dated Sep. 3, 2025 received for ROC (Taiwan) Application No. 202310431130. X, filed Apr. 21, 2023; 8 pages total.
Office Action dated Dec. 2, 2025, issued in U.S. Appl. No. 17/832,335, filed Jun. 3, 2022; 14 pages.

* cited by examiner

*INCIDENT LIGHT* 50

240-1    240-2    240-1    240-2    240-1

250
110
220
100
50-2
232
60
210
120
210

*PD RATIO @ CRA VS FIELD - Gb*

PD RATIO @ CRA VS FIELD - R

FIELD

HALF QUAD PHOTODIODE (QPD) TO IMPROVE QPD CHANNEL IMBALANCE

BACKGROUND INFORMATION

Field of the Disclosure

This disclosure relates generally to the design of image sensors, and in particular, relates to image sensors that use different arrangements of microlenses to improve channel imbalance among pixels of the image sensor.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

In some applications, each pixel of the image sensor includes several subpixels (e.g., two green subpixels, one red subpixel, and one blue subpixel). Individual subpixels are covered with microlenses that may be misaligned, for example, through manufacturing errors that place the microlenses off-center with respect to the middle of the corresponding subpixel. Furthermore, microlenses may be offset over the subpixels as a design feature that differently focuses light over differently positioned subpixels (e.g., centrally located subpixel vs. peripherally located subpixel within the image sensor). In some instances, such non-uniform placement of the microlenses (either as manufacturing error or by design) over the total area of image sensor causes different sensitivities to the incoming light. For example, a red subpixel at a left edge of the image sensor may be more sensitive to the incoming light than a similarly located blue subpixel. Following the same hypothetical example, the sensitivities of the red and blue subpixels may be inverted at the right edge of the image sensor. Analogous differences in light sensitivity may exist with respect to the upper/lower edges of the image sensor and also with respect to different subpixels (e.g., green subpixel having different sensitivity than red or blue subpixels). Such differences in sensitivities affect accuracy of the photodiode light intensity reading. Therefore, systems and methods are needed for a more uniform light sensitivity among the subpixels and pixels of the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
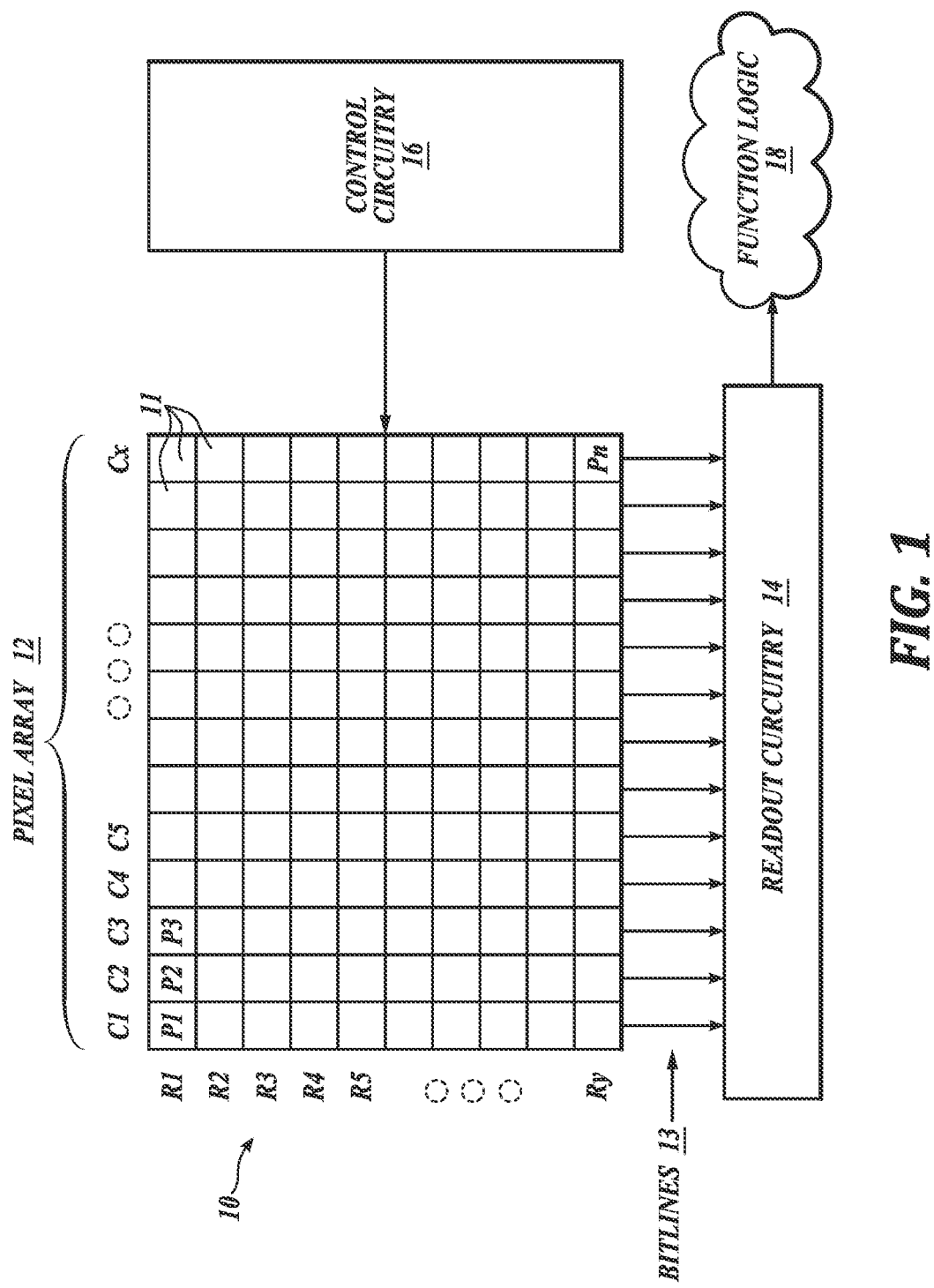
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors with microlenses that are arranged to improve channel imbalance among pixels of the image sensor are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means +/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to image sensors where the microlenses are distributed over individual photodiodes or subpixels (i.e., groups of photodiodes of the same color, also referred to as subunit cells or subunits). In some embodiments, distribution of microlenses is spatially biased such that the centrally located subpixels are covered with the centrally located microlenses, i.e., these microlenses are placed over the middle of their corresponding subpixels within the bounds of manufacturing tolerance. Conversely, the subpixels that are peripherally located within the image sensor are covered by the microlenses that are offset (also referred to as "biased") toward the center of the image sensor, i.e., the microlenses are offset from the center of their corresponding subpixels or photodiodes toward the center of the image sensor. Such spatial offsetting (biasing) of the microlenses tends to uniformize sensitivity of the subpixels to the incoming light. In different embodiments, the offsets may be linear (i.e., linearly changing offsets from the center to the periphery of the pixel array) or nonlinear.

With prior art image sensors, microlenses typically cover the entire subpixels of a given pixels. For example, for a pixel having one blue, one red and two green subpixels, four microlenses may be arranged over the individual subpixels. In some embodiments of the present technology, the microlenses are distributed over individual photodiodes for some subpixels in a pixel and over the entire subpixels for some other subpixels in a pixel. For example, smaller microlenses may be arranged over individual photodiodes of the red and blue subpixels (e.g., 4 smaller microlenses for the 4 photodiodes of the red subpixel, and 4 smaller microlenses for the 4 photodiodes of the blue subpixel), while the entire green subpixel is covered with just one larger microlens (e.g., all 4 photodiodes of the green subpixels being covered by a single, larger microlens). Other combinations of small/large microlenses are possible in different embodiments. In at least some embodiments, smaller microlenses result in a more uniform quantum efficiency (QE) of the photodiodes. Additionally, limiting the number of subpixels with smaller microlenses may reduce the overall complexity of the design at an acceptable penalty in terms of nonuniform QE.

FIG. 1 is a diagram of an example image sensor 10 in accordance with an embodiment of the present technology. The image sensor 10 includes a pixel array 12, a control circuitry 16, a readout circuitry 14 and a function logic 18. In one example, the pixel array 12 is a two-dimensional (2D) array of image sensor pixels 11 (e.g., pixels P1, P2 . . . , Pn). Each image sensor pixel 11 includes multiple photodiodes (PDs) for light detection. As illustrated, the image sensor pixels 11 are arranged into rows (e.g., rows R1 to Ry) and columns (e.g., columns C1 to Cx). In operation, the image sensor pixels 11 acquire image data of a scene, which can then be used to render a 2D image of person, place, object, etc. However, in other embodiments the image sensor pixels 11 may be arranged into configurations other than rows and columns.

In an embodiment, after each image sensor pixel 11 in the pixel array 12 acquires its image charge, the image data is read out by the readout circuitry 14 via bitlines 13, and then transferred to a function logic 18. The readout image data of each image sensor pixel 11 collectively constitute an image frame. In various embodiments, the readout circuitry 14 may include signal amplifiers, analog-to-digital (ADC) conversion circuitry and data transmission circuitry. The function logic 18 may store the image data or even manipulate the image data by applying post image effects (e.g., crop, rotate, remove red eye, adjust brightness, adjust contrast, or otherwise). In some embodiments, the control circuitry 16 and function logic 18 may be combined into a single functional block to control the capture of images by the image sensor pixels 11 and the readout of image data from the readout circuity 14. The function logic 18 may include a digital processor. In an embodiment, the readout circuitry 14 may read one row of image data at a time along readout column lines (bitlines 13) or may read the image data using a variety of other techniques, such as a serial readout or a full parallel readout of all pixels simultaneously.

In an embodiment, the control circuitry 16 is coupled to the pixel array 12 to control operation of the plurality of photodiodes in the pixel array 12. For example, the control circuitry 16 may generate a shutter signal for controlling image acquisition. In an embodiment, the shutter signal is a global shutter signal for simultaneously enabling all pixels within the pixel array 12 to simultaneously capture their respective image data during a single data acquisition window. In another embodiment, the shutter signal is a rolling shutter signal such that each row, column, or group of pixels is sequentially enabled during consecutive acquisition windows. In another embodiment, image acquisition is synchronized with lighting effects such as a flash. In different embodiments, the control circuity 16 may be configured to control each of image sensor pixels 11 to perform the acquiring operations of one or more dark current pixel frames for image calibration and normal image frames.

In one embodiment, readout circuitry 14 includes analog-to-digital converters (ADCs), which convert analog image data received from the pixel array 12 into a digital representation. The digital representation of the image data may be provided to the function logic 18.

In different embodiments, image sensor 10 may be part of a digital camera, cell phone, laptop computer, or the like. In embodiments, image sensor 10 is incorporated as part of surveillance system or vision system for automobile. Additionally, image sensor 10 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to the image sensor 10, extract image data from the image sensor 10, or manipulate image data supplied by image sensor 10.

Figure 2:
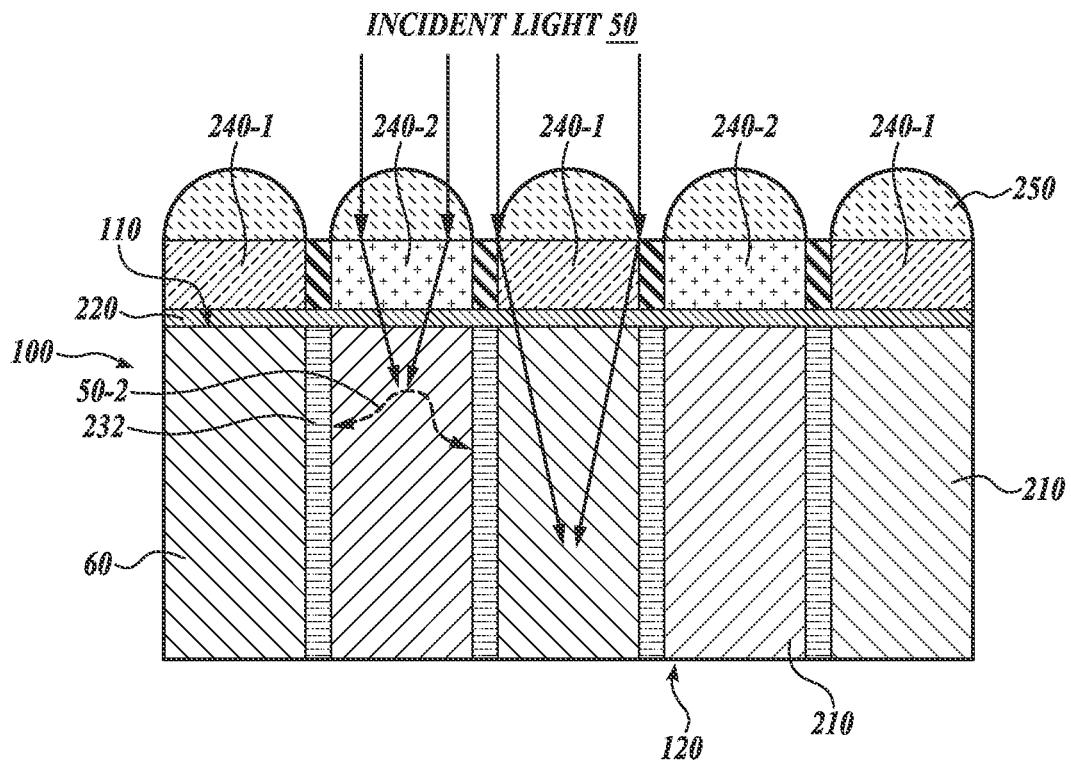
FIG. 2 is a cross-sectional side view of an example image sensor in accordance with embodiments of the present technology.

FIG. 2 is a cross-sectional side view of an example image sensor in accordance with embodiments of the present technology. In operation, incident light 50 enters the image sensor 100 through microlenses 250 and color filters 240, which focus and appropriately color-filter the incident light for a given photodiode (PD) 210 inside a semiconductor material 60 (e.g., doped silicon). For example, a green photodiode 210 may be covered by a green color filter 240 that transmits green light, while reflecting other wavelengths of light. In some embodiments, a dielectric layer 220 (also referred to as a planarization layer or buffer oxide layer) separates the color filters 240 from the photodiodes 210. Photodiodes 210 operate to photogenerate electrical charge based on the incoming light 50. These electrical charges are subsequently selectively drained into the associated supporting electronics of the photodiode 210, for example, a floating diffusion associated with the photodiode 210 through a respective coupled transfer transistor.

The photodiodes 210 may be prone to crosstalk. For example, the incoming light 50, for example light of longer wavelength such as red or infrared light may enter a PD 210 through a microlens 250 and a color filter 240-2, where the light is partially absorbed and partially transmitted in the direction of the neighboring PD 210, for example by refraction or reflection induced crosstalk. Such optical crosstalk occurs without the light passing through color filter 240-1 as designed for. Therefore, in some embodiments, the neighboring photodiodes 210 are separated by isolation structures 232 that limit propagation of stray light from one photodiode to another. Some examples of such isolation structures are deep trench isolation (DTI) structures 232 that vertically extend up to a depth (e.g., 1.5 um to 2.5 um) into the Silicon (Si) material from a backside 110 of the semiconductor material 60 (illuminated side of the image sensor). In different embodiments, the DTI structure 232 may include materials that are non-transparent to light, for example metals. In some embodiments, the DTI structure 232 may include dielectric material with refractive index lower than the semiconductor material such as silicon oxide. The DTI structure 232 may prevent or at least reduce the stray light from reaching the neighbor photodiodes. The illustrated DTI structures 232 extend essentially throughout the entire thickness of the Si material layer, but in different embodiments the DTI structures may extend only partially between the adjacent photodiodes. In one example, DTI structures 232 are interconnected thus forming a grid structure surrounding the PDs 210 and providing electrical and/or optical isolation between adjacent PDs.

Figure 3:
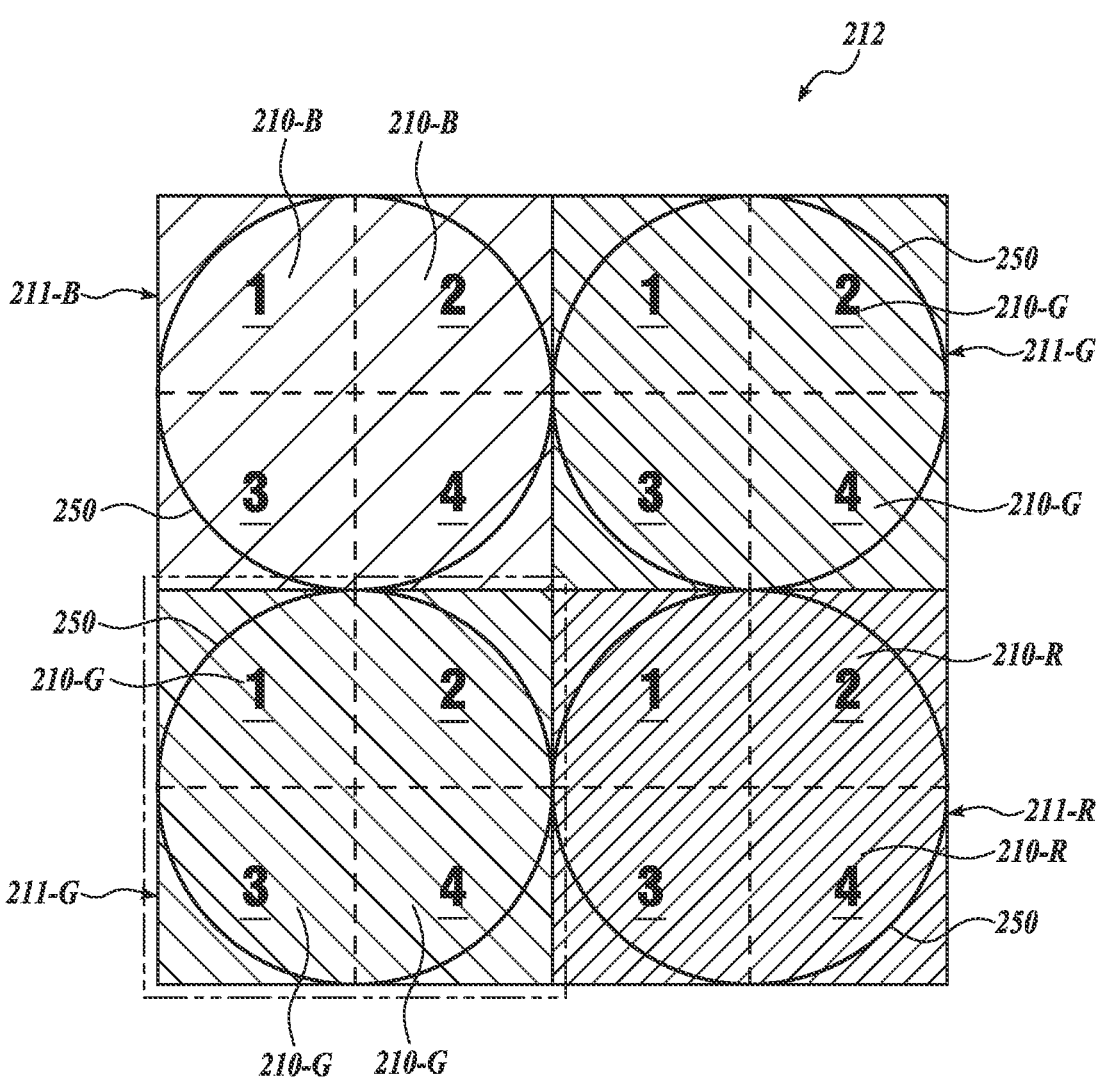
FIG. 3 is a top schematic view of an arrangement of microlenses over a pixel in accordance with an embodiment of the present technology.

FIG. 3 is a top schematic view of an arrangement of microlenses over a pixel 212 in accordance with an embodiment of the present technology. Illustrated pixel 212 (also referred to as a unit or a unit cell) includes 4 subpixels 211 (also referred to as subunits or subpixels). These subpixels are enumerated as 211-B for the blue subpixel, 211-G for the green subpixels and 211-R for the red subpixel. Therefore, the illustrated pixel 212 includes 4 subpixels, however different numbers and combinations of subpixels within a pixel are also possible in different embodiments.

Each subpixel 210-$i$ includes 4 photodiodes (PDs) 210 (e.g., 210-B signifying blue PDs, 210-G signifying green PDs and 210-R signifying red subpixels). Therefore, the pixel 212 is also referred to as the quad photo-diode (QPD) pixel. The subpixels are marked by numerals 1, 2, 3 and 4 for convenience of calculating photodiode right-to-left (PDRL) and left-to-right (PDLR) ratios, as further explained below with respect to FIGS. 4A-4C. In different embodiments, subpixels may include different numbers of PDs.

Photodiodes 210 are covered with microlenses 250 that focus the incoming light. In the illustrated embodiment, each subpixel 210 is uniformly covered with a single microlens 250. However, in different embodiments other distributions of microlenses 250 are possible, as further explained below.

Figure 4A:
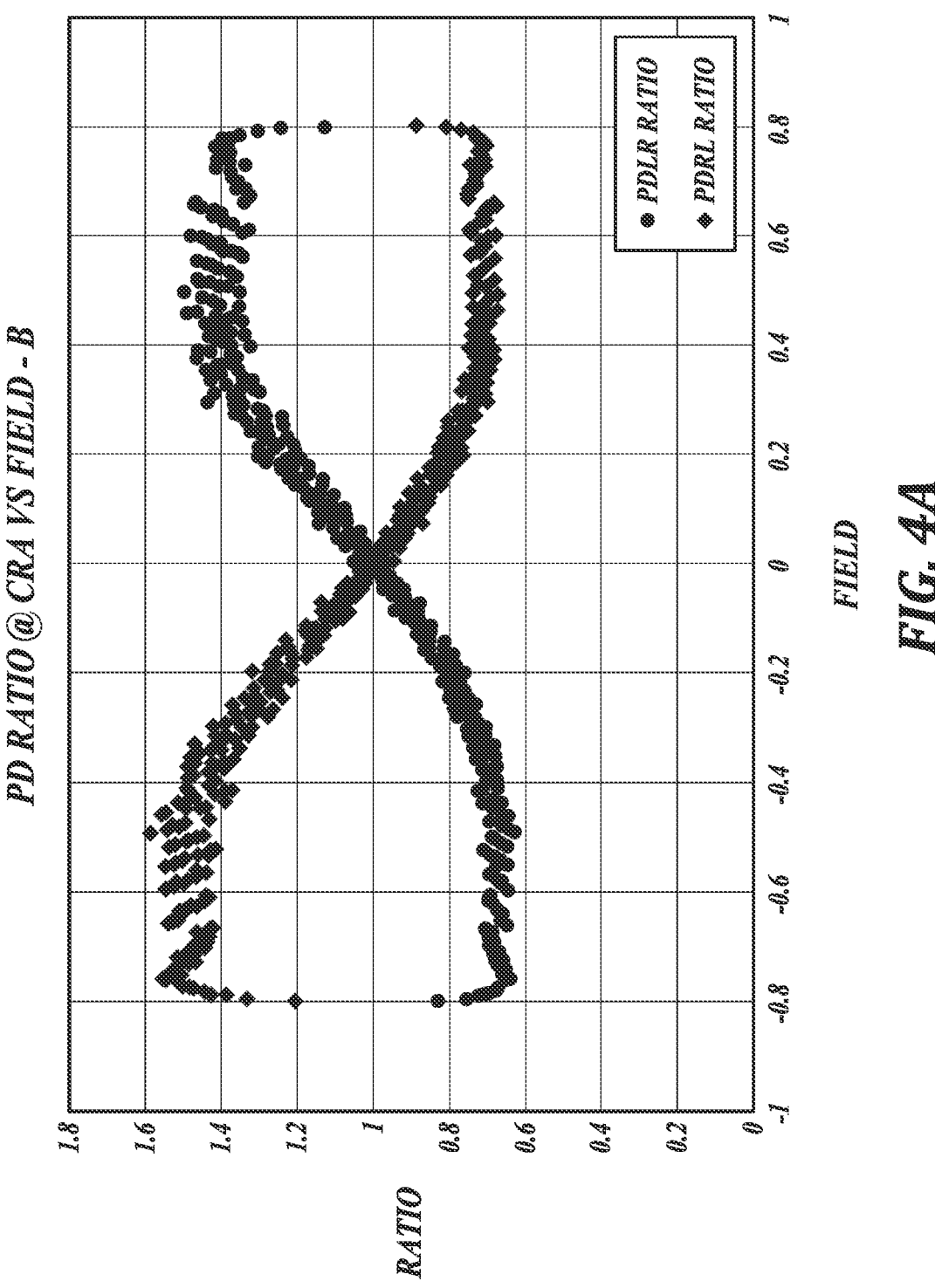
FIGS. 4A-4C are graphs of photodiode ratio as a function of field angle in accordance with embodiments of the present technology.
Figure 4B:
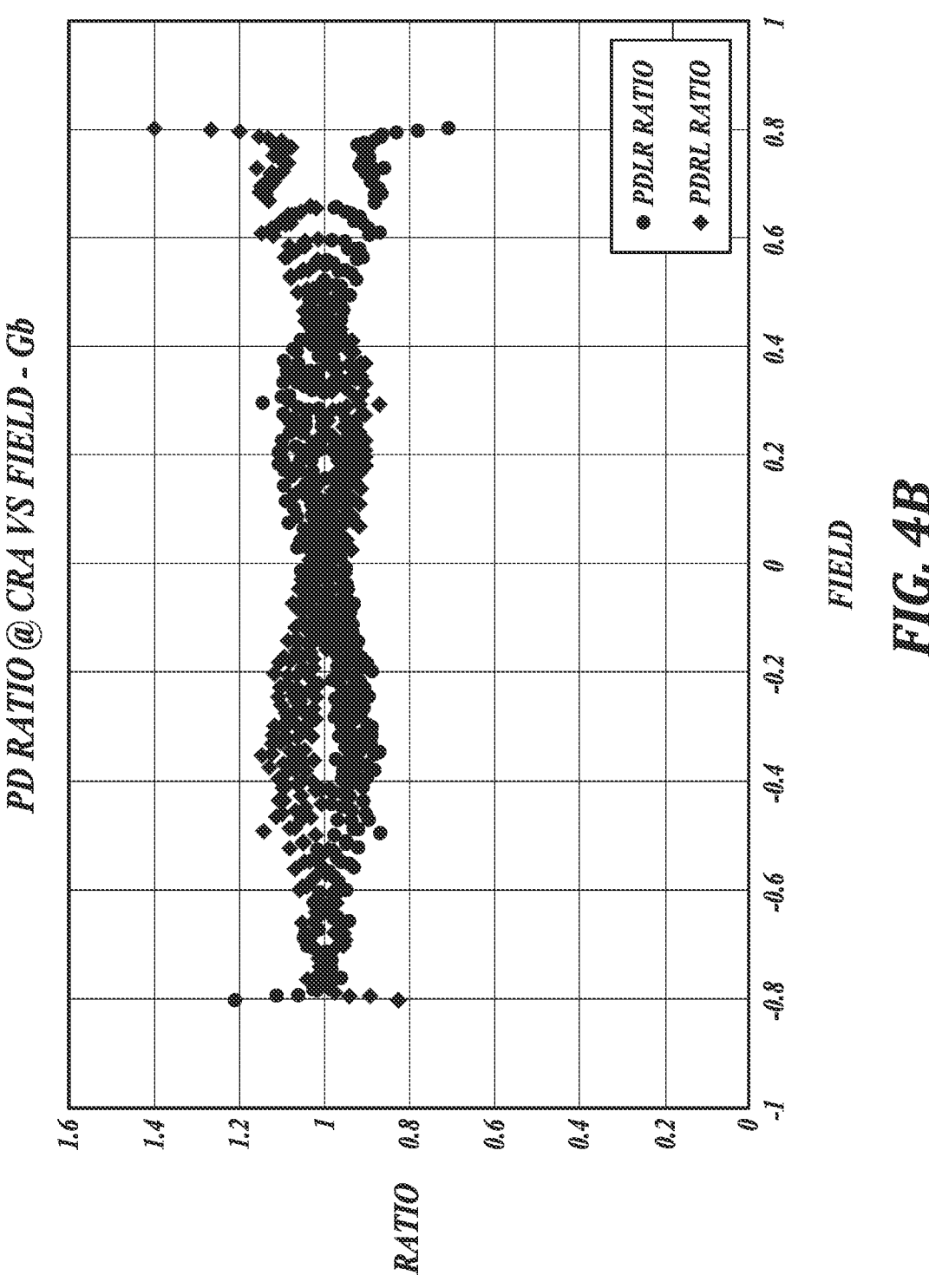
Figure 4C:
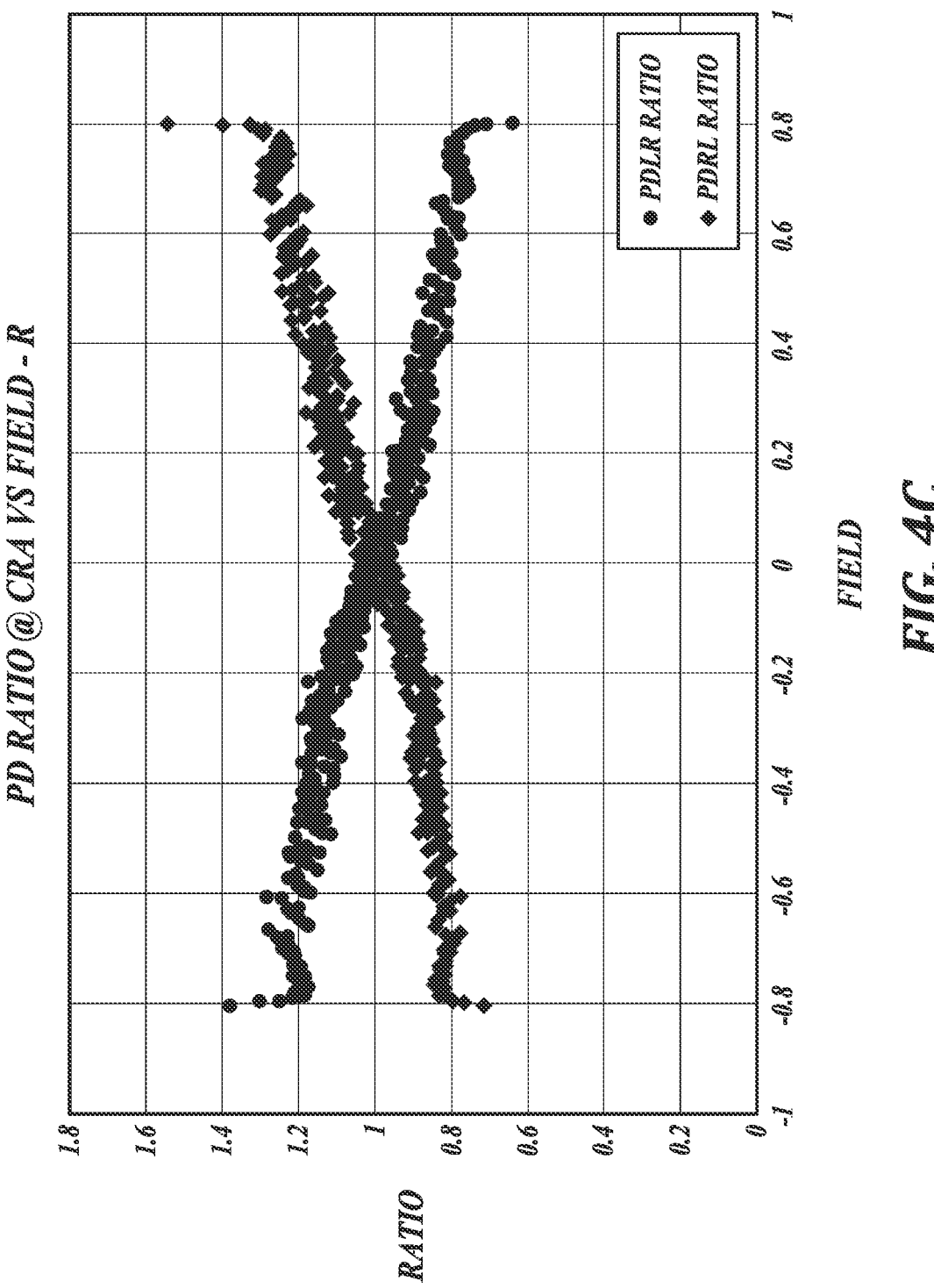

FIGS. 4A-4C are graphs of photodiode ratios as a function of field angle in accordance with embodiments of the present technology. The horizontal axis of the graphs represents a normalized field for the incoming light. In these graphs, horizontal direction of the PDLR ratio is used as an example. The normalized field ranges from −0.8 to 0.8, and may be interpreted as a distance from the center of the image sensor where the center is represented by "0", left side edge is represented by "−0.8" and right side edge is represented by "0.8." The vertical axis represents PDRL and PDLR ratios, which can be defined with reference to FIG. 3 for each subpixel as:

$$PDLR = \text{(light intensity of PDs 1+3)/(light intensity of PDs 2+4), and}$$

$$PDRL = \text{(light intensity of PDs 2+4)/(light intensity of PDs 1+3).}$$

In particular, FIG. 4A illustrates the PDLR and PDRL ratios for the blue subpixel 211-B, FIG. 4B illustrates the ratios for the green subpixel 211-G and FIG. 4C illustrates the ratios for the red subpixel 211-R. FIG. 4A illustrates that for the ratios for the blue subpixel 211-B close to the "0" field, the PDLR and PDRL ratios are close to 1. In many practical applications such PDLR and PDRL ratios may be acceptable for the pixels that are close to the center of the image sensor. However, the more peripheral pixels are characterized by a relatively high PDLR and PDRL that may reach or even exceed 1.5 for the field angles at about −0.8 or 0.8.

FIG. 4B illustrates the PDLR and PDRL ratios for the green subpixel 211-G. Here, the PDLR and PDRL at the periphery of the image sensor are not as high, being limited to a range of about 0.9-1.1 for most of the green pixels that span the image sensor from its left edge to its right edge. Therefore, the green subpixels 211-G appear less sensitive to changes in field values along the span of the image sensor. In some embodiments, such range of sensitivity for the green pixels may be acceptable for many operational conditions.

FIG. 4C illustrates the PDLR and PDRL ratios for the red subpixel 211-R. Here, the PDLR and PDRL are again relatively high (about 1.4 or more) at the periphery of the image sensor.

Figure 5:
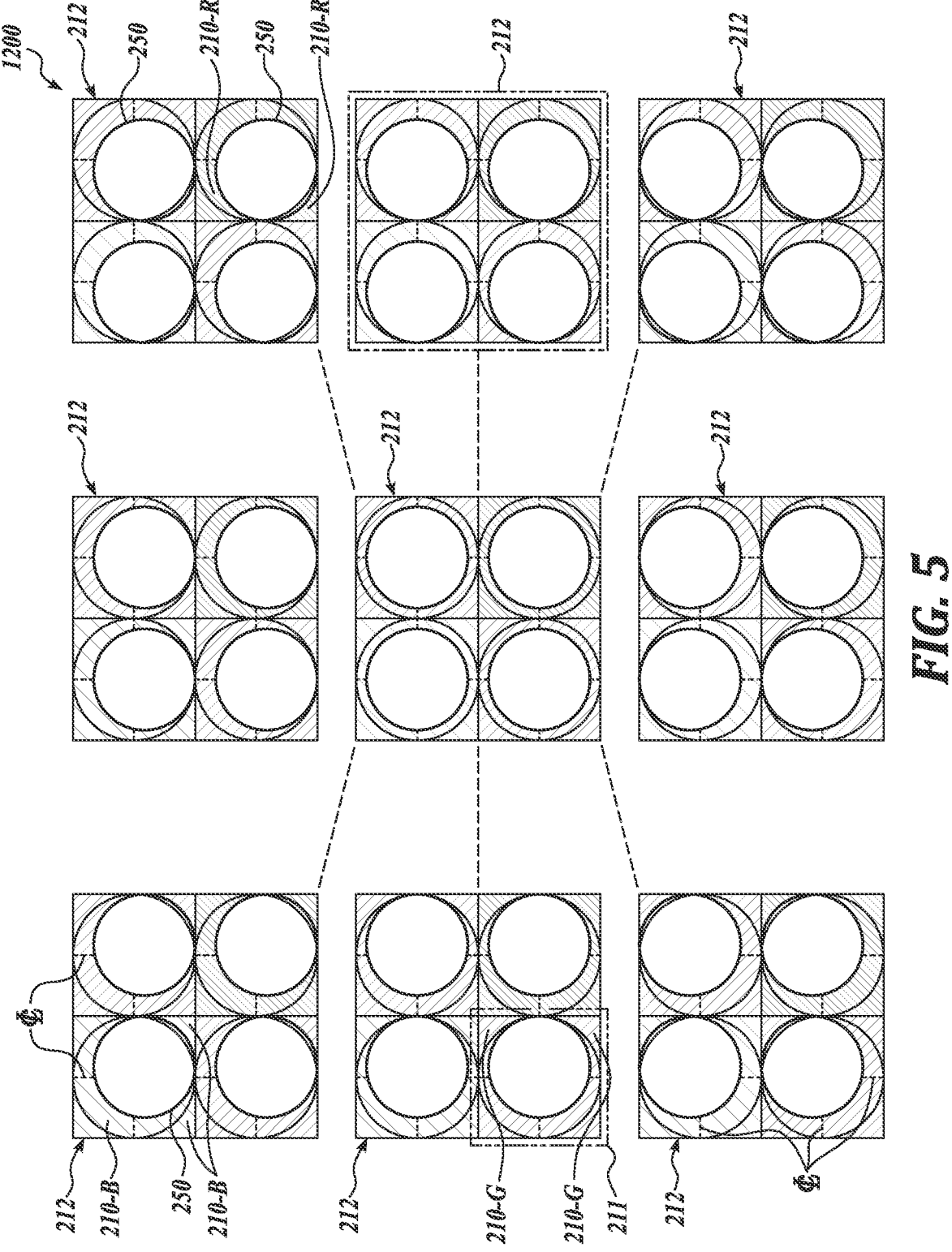
FIG. 5 is a top schematic view of an arrangement of microlenses over a pixel array in accordance with an embodiment of the present technology.

FIG. 5 is a top schematic view of an arrangement of microlenses in a pixel array 1200 in accordance with an embodiment of the present technology. Several representative pixels 212 are illustrated for clarity of presentation, however, a realistic pixel array of an image sensor would generally include significantly higher number of pixels. The representative pixels 212 include a centrally-located pixel and several peripherally-located pixels (at left/right and up/down edges). As explained with reference to FIGS. 4A-4C, the centrally-located pixel is generally characterized by the PDLR and PDRL of close to 1, in contrast to the peripherally-located pixels that in some cases may be characterized by relatively high values of PDLR and PDRL. In the context of this application, the centrally-located pixels are the pixels in vicinity of the center of the pixel array (e.g., within 1% or 2% or 5% of the width or height of the pixel array). Conversely, the peripherally-located pixels are the pixels that in the vicinity of the outer edges of the pixel array (e.g., within 1% or 2% or 5% of the width or height of the pixel array).

In some embodiments, the relatively high values of PDLR and PDRL may be reduced by offsetting (biasing) the locations of the microlenses away from the centerlines CL of their respective subpixels 211 and toward the center of the pixel array. For example, the microlenses 250 over the subpixels 211 that are close to the left edge of the pixel array are biased to the right, the microlenses over the subpixels that are close to the upper edge of the pixel array are biased toward the lower edge of the pixel array, etc. In some embodiments, such biasing (offsetting) of the microlenses may be in the range of 0.3-0.4 µm, 0.4-0.5 µm, 0.5-0.6 µm around outer edge of the pixel array, or within other ranges, depending on the size of the photodiodes. In different embodiments, such biasing may be linear (i.e., the biasing of microlenses 250 scales linearly with the distance from the center of the pixel array) or non-linear.

Figure 6:
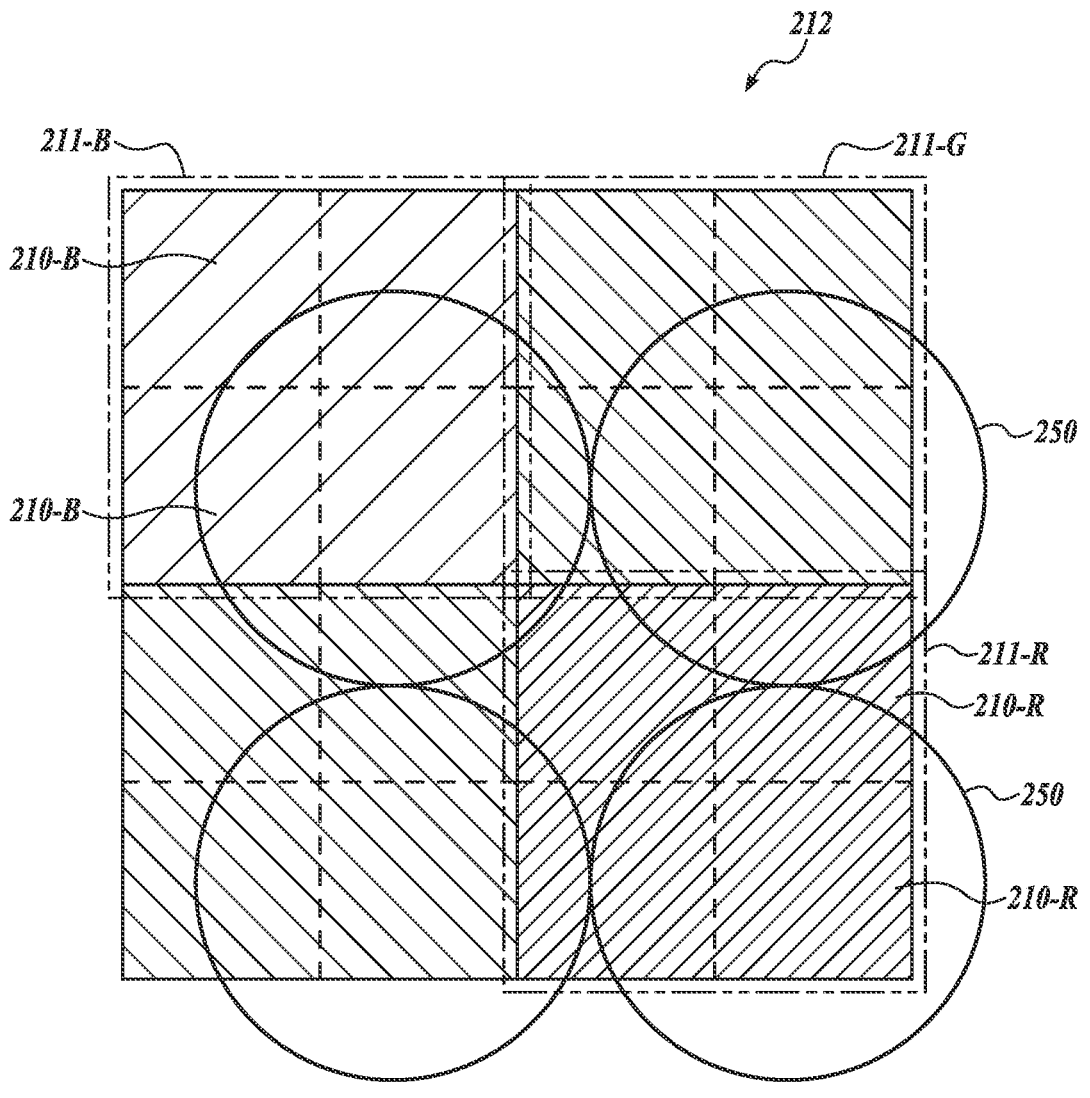
FIG. 6 is a top schematic view of a misalignment of microlenses over a quad photodiode (QPD) pixel.

FIG. 6 is a top schematic view of a misalignment of microlenses over a quad photodiode (QPD) pixel 212. The illustrated pixel 212 is generally centrally-located within the pixel array, therefore the target placement of the microlenses 250 is at the centers of the corresponding subpixels 211. However, manufacturing tolerances or manufacturing errors may result in misplacement of the microlenses 250. In some embodiments, such misplacements may be on the order of several tens of nm, for example 20 nm. Once the pixel 212 is in operation, the errors in the microlens placement cause incorrect focusing of the incoming light, resulting in the reduced accuracy of the of the image sensor.

Figure 7:
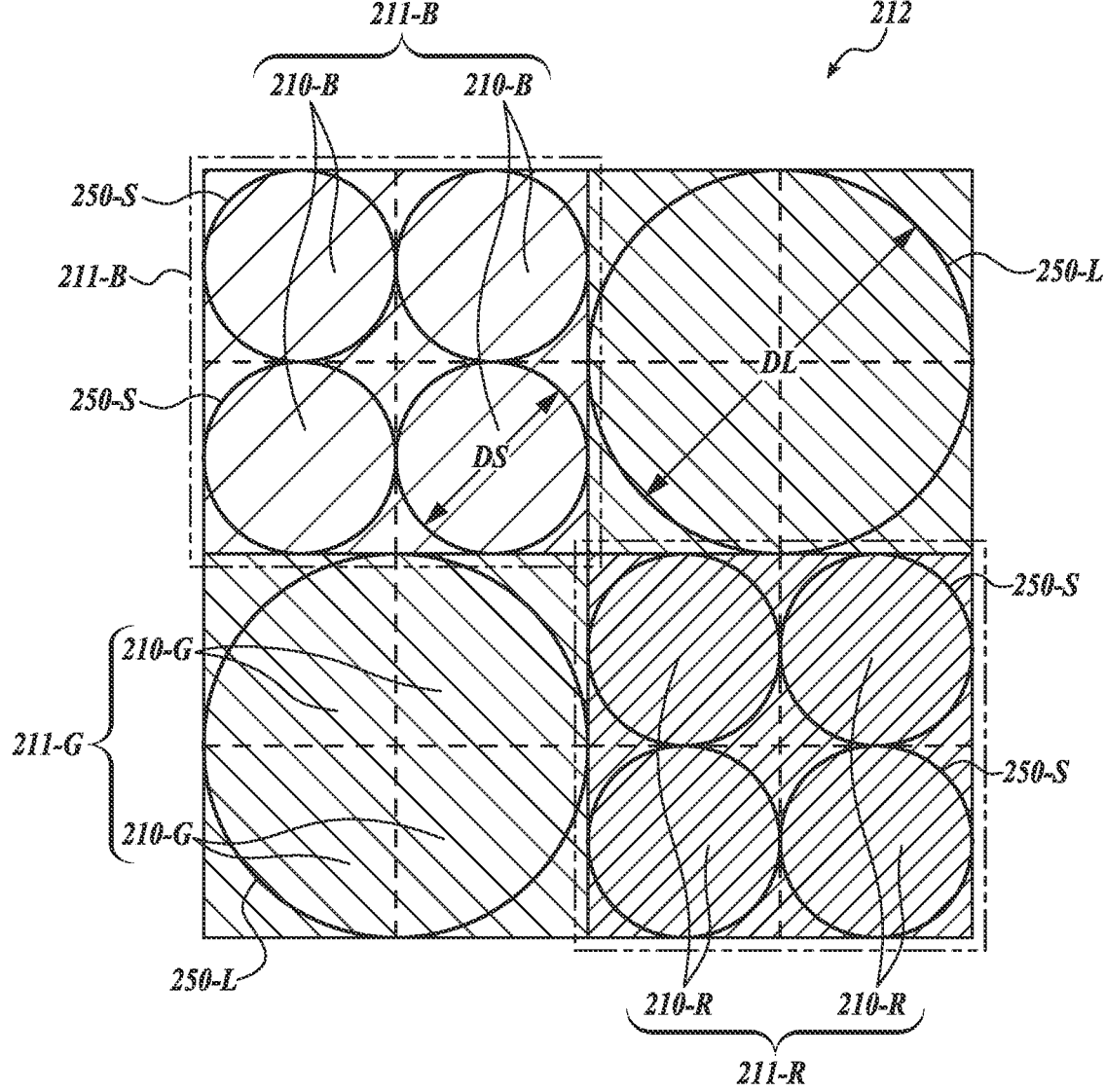
FIG. 7 is a top schematic view of an arrangement of microlenses over a half QPD pixel in accordance with an embodiment of the present technology.
Figure 8:
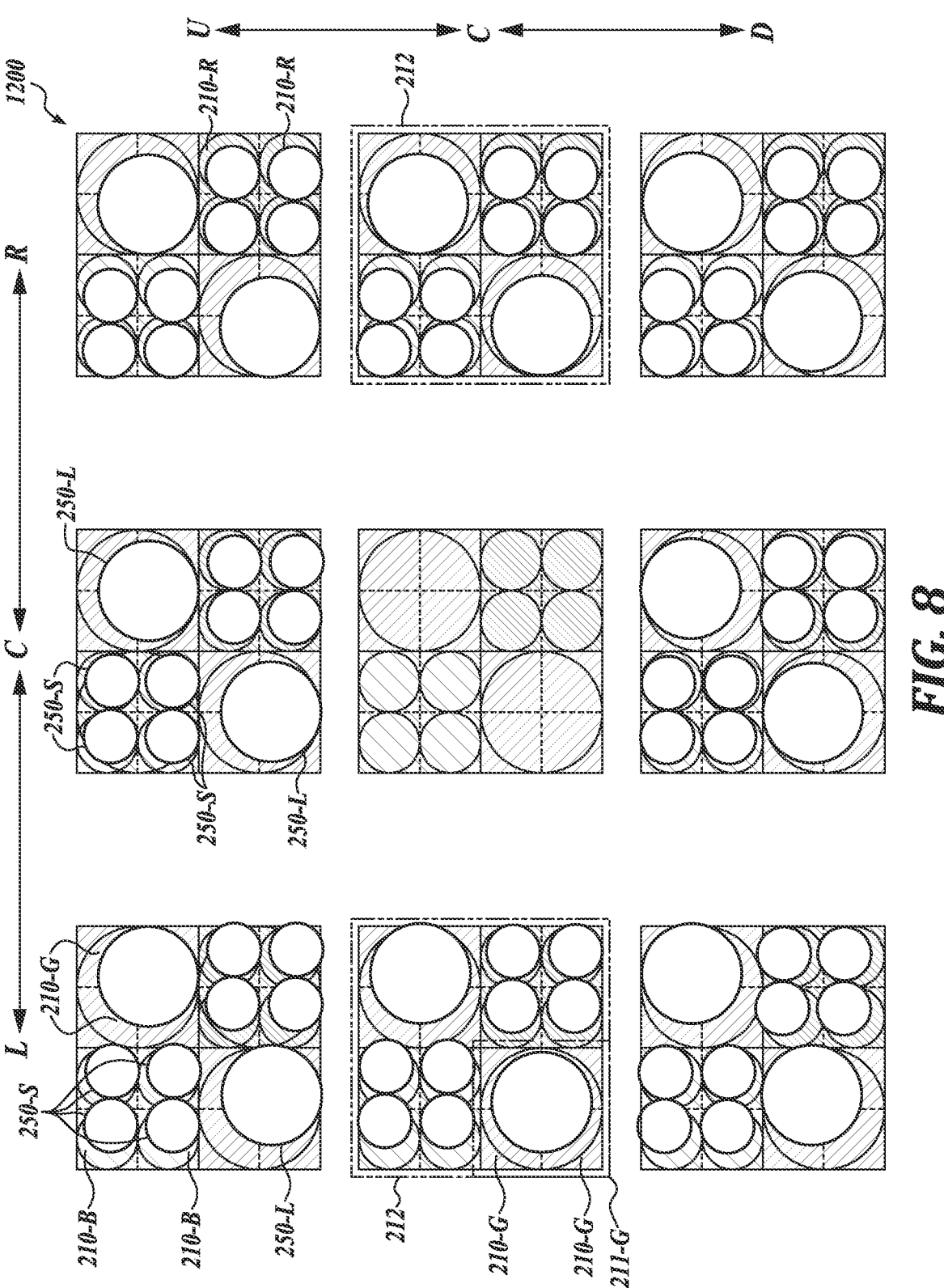
FIG. 8 is a top schematic view of an arrangement of microlenses over a pixel array in accordance with an embodiment of the present technology.

FIG. 7 is a top schematic view of an arrangement of microlenses over a half QPD pixel 212 in accordance with an embodiment of the present technology. In at least some embodiments, manufacturing errors in placing the microlenses are reduced by using differently sized microlenses, that is, using the microlenses with different characteristic diameters. For example, small microlenses 250-S (having a characteristic diameter DS) may be placed over individual photodiodes 210-B (blue photodiodes) and 210-R (red photodiodes), while large microlenses 250-L (having a characteristic diameter DL) are placed over groups of photodiodes 210-G (green photodiodes) of the subpixel 211-G. In some embodiments, the presence of small microlenses 250-S may limit the amount of the manufacturing error and/or tolerance when placing the microlenses. However, keeping all other variables same, a larger number of smaller microlenses makes the manufacturing process more expensive and/or slower. Therefore, in the illustrated embodiment the small microlenses 250-S are used in combination with the large microlenses 250-L. Such pixels are also referred to as half quad photodiode (half QPD) in the context of this application. In the illustrated embodiments, the small microlenses 250-S may be used over the blue and red photodiodes while the large microlenses 250-L are used over the green subpixels. An embodiment of a pixel array with mixed sizes of the microlenses is illustrated in FIG. 8 below. A possible basis for deciding where to use the small microlenses 250-S and where to use large microlenses 250-L is explained with reference to FIGS. 9A-9D below.

FIG. 8 is a top schematic view of an arrangement of microlenses over a pixel array in accordance with an embodiment of the present technology. Analogously to the pixel array of FIG. 5, just several representative pixels 212 are illustrated for clarity of presentation, however, a realistic pixel array of an image sensor would generally include significantly higher number of pixels. The representative pixels 212 include a centrally-located (C) pixel and several peripherally-located pixels at the left (L), right (R), up (U) and down (D) edges. For all illustrated pixels 212, the blue subpixels 210-B and red subpixels 210-R are covered with four small microlenses 250-S. In particular, each photodiode 210-B and 210-R is covered with one small microlens 250-S, while each subpixel 211-G (having four photodiodes 210-G) is covered with one large microlens 250-L. In at least some embodiments, such distribution of small microlenses 250-S and large microlenses 250-L provides an acceptable tradeoff between the complexity of the manufacturing process and accuracy of the images obtained by the pixel array 1200. In some embodiments, the microlenses 250-S and 250-L are offset (biased) toward the center of the pixel array 1200 and away from the centerpoints of their corresponding photodiodes 210 (in case of the small microlenses 250-S) or their corresponding subpixels 211 (in case of the large microlenses 250-L). In the illustrated embodiment, each subpixel 211 includes four photodiodes 210, but in different embodiments different numbers of photodiodes per subpixel are also possible.

FIGS. 9A-9D are graphs of simulated quantum efficiency as a function of wavelength of the incoming light in accordance with embodiments of the present technology. In each of the graphs, the horizontal axis represents the wavelength of the incoming light in nm. The vertical axis represents quantum efficiency (QE) of the blue, red and green photodiodes. In each case, the placement error or overlay of the microlenses (ML OVL) is 20 nm.

Figure 9A:
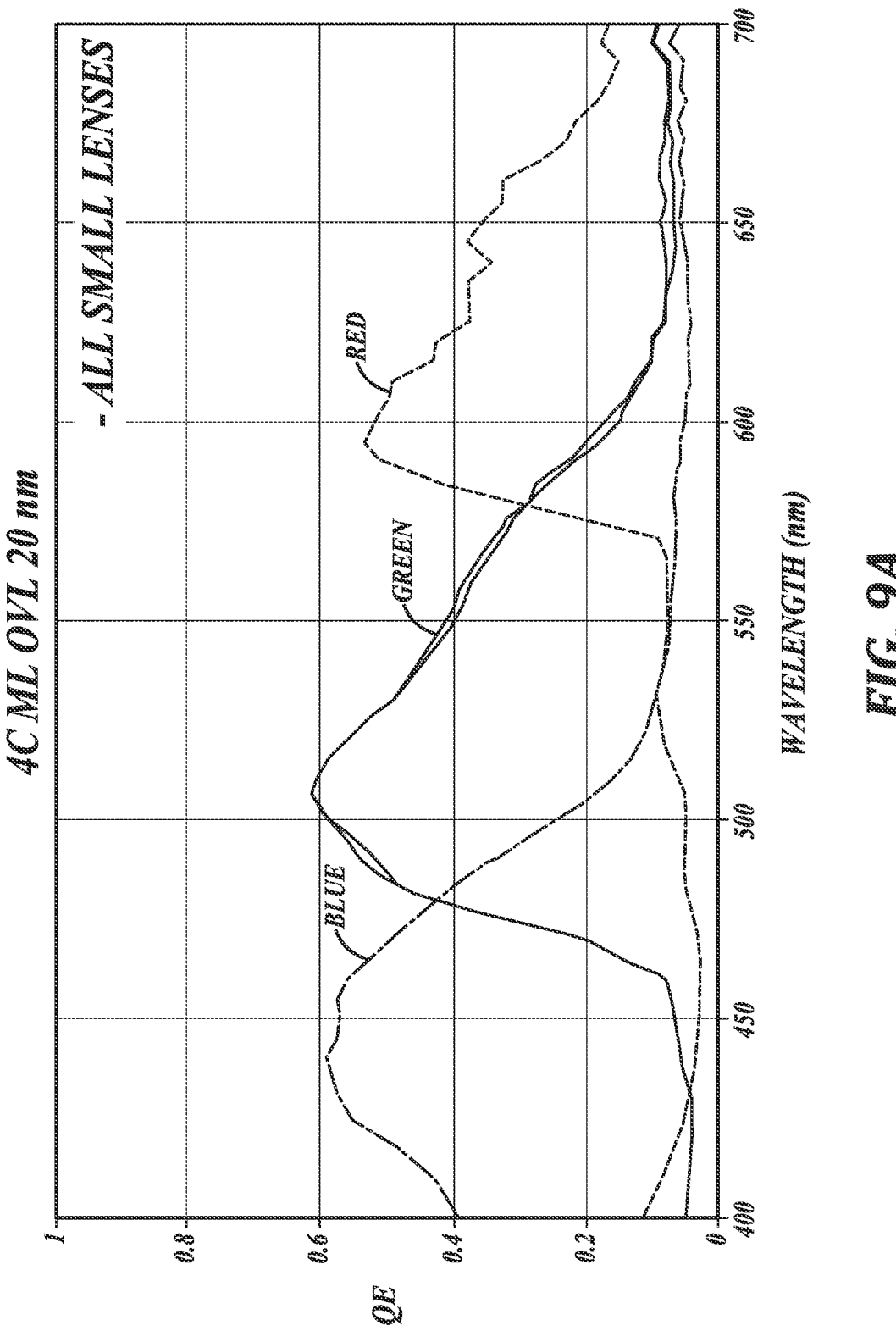
FIGS. 9A-9D are graphs of simulated quantum efficiency as a function of wavelength of the incoming light in accordance with embodiments of the present technology.

FIG. 9A illustrates a case where small microlenses 250-S are used uniformly over all photodiodes 210 of the subpixels 211 irrespective of the color that the photodiodes primarily detect. As a result, all photodiodes 210 in a given color group are characterized by a relatively uniform QE across the pixel array, which is generally a desired outcome. However, as explained above, a large number of microlenses carries penalties related to the cost and complexity of such approach. Furthermore, in many instances some amount of the QE spread may be desired for, for example, green subpixels, because the QE spread may improve autofocusing and/or face recognition capability of the image sensor, everything else being equal.

Figure 9B:
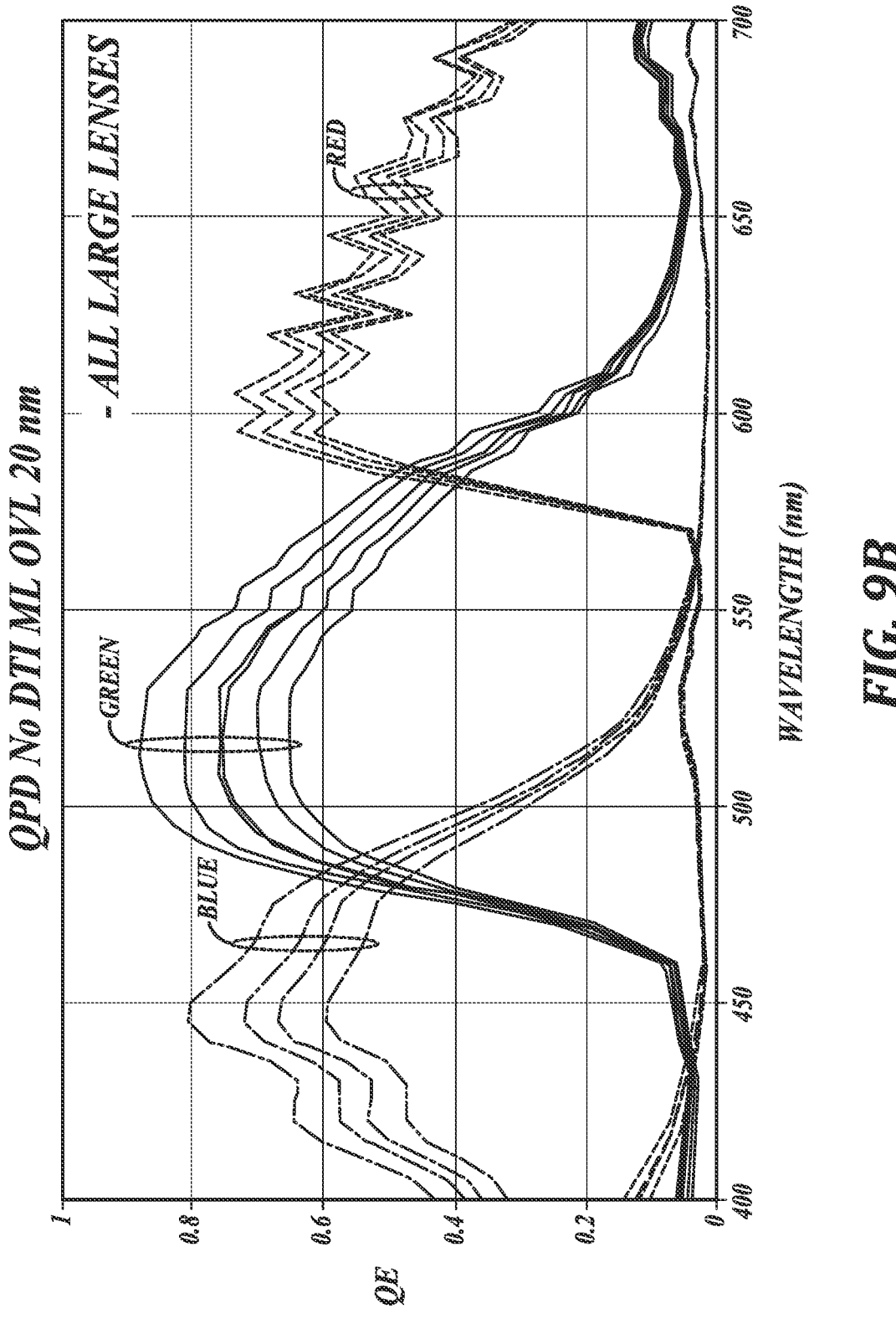
Figure 9C:
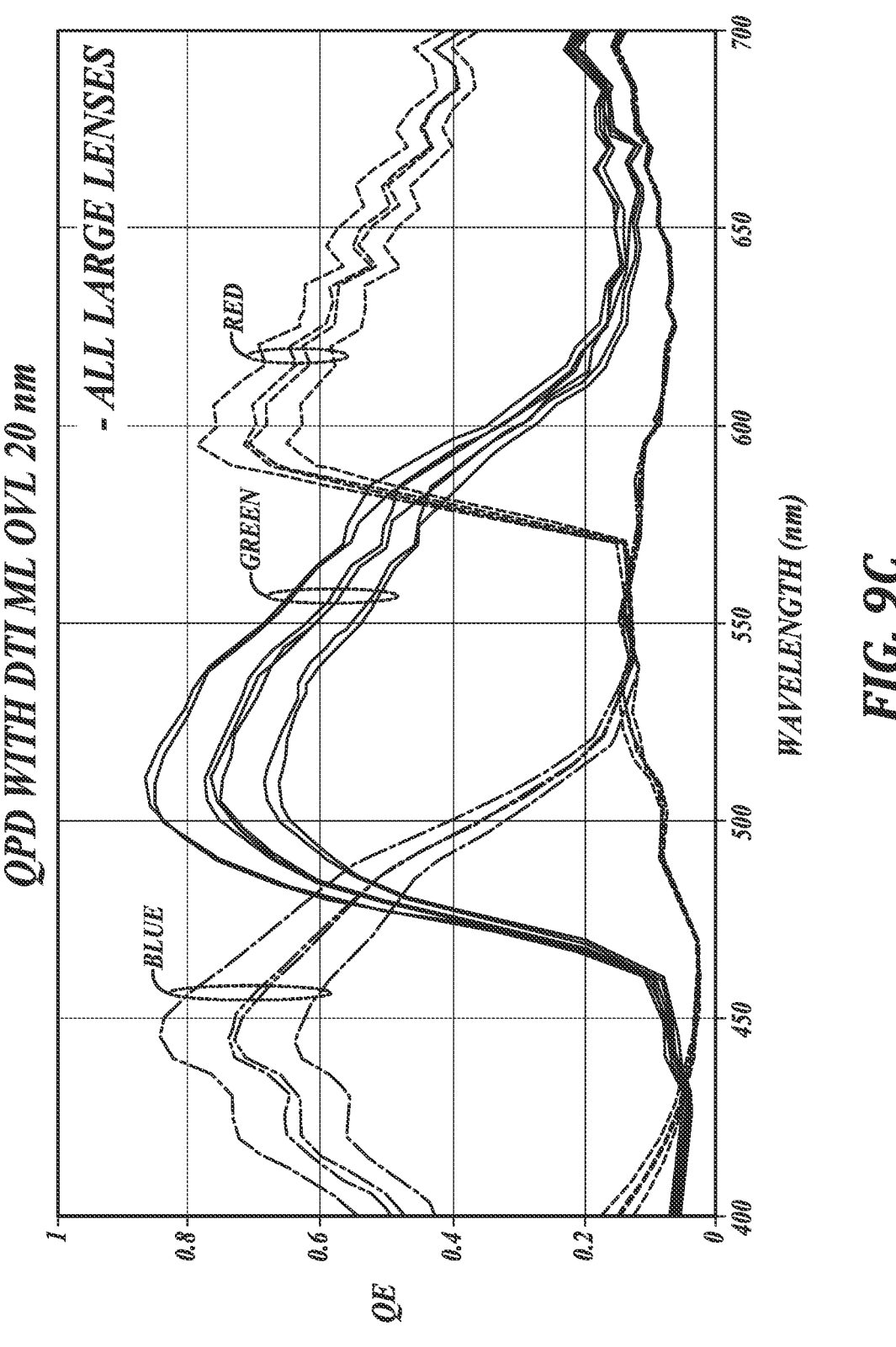

FIGS. 9B and 9C illustrates a case where large microlenses 250-L are used uniformly over all subpixels 211 irrespective of the color that the photodiodes primarily detect. FIG. 9B illustrates the case without deep trench isolation (DTI), and FIG. 9C illustrates the case with the DTI. Whether the photodiodes are separated by the DTI or not, the resulting QE over differently located photodiodes is characterized by a relatively large spread in QE values for each simulated color (also referred to as a channel imbalance). As explained above, while some amount of the QE spread may be acceptable and, in fact, be beneficial for the green photodiodes, the QE spread should be narrower for the red and blue photodiodes.

Figure 9D:
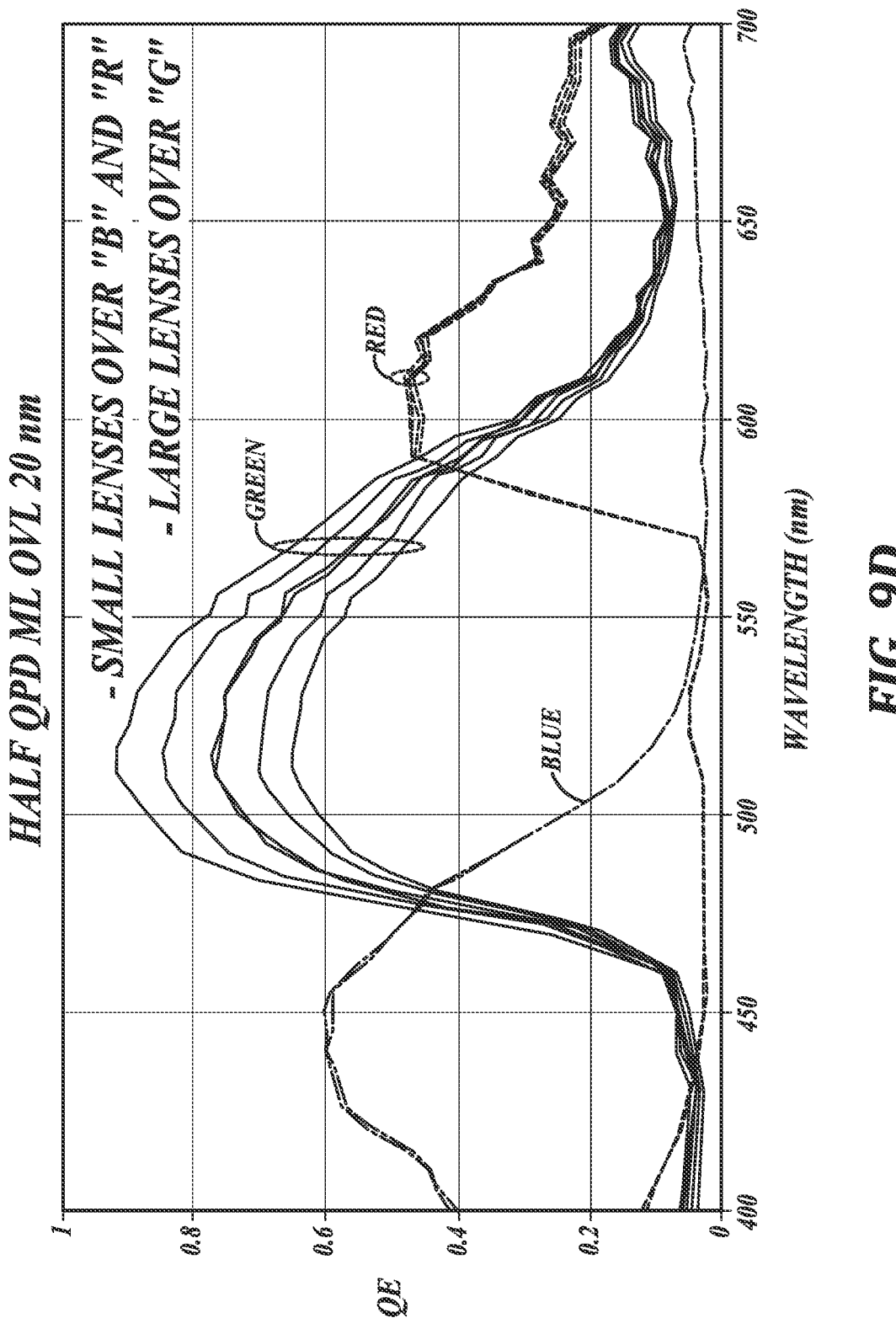

FIG. 9D illustrates a case where small microlenses 250-S are used over red photodiodes 210-R and blue photodiodes 210-B, while large microlenses 250-L are used over groups of photodiodes 210-G of a given subpixel 211-G. Here, the QE spread is narrowed for the red and blue photodiodes, because of the effect of the small microlenses 250-S, while the QE spread of the green photodiodes (where large microlenses 250-L are used) may be sufficient to facilitate auto-focusing and/or face recognition. Furthermore, the manufacturing complexity and/or cost is reduced in comparison to the case where the small microlenses are uniformly used for the entire pixel array.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured, or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a plurality of pixels arranged in rows and columns of a pixel array disposed in a semiconductor material, wherein each pixel comprises a plurality of subpixels and each subpixel comprises a plurality of first photodiodes, a plurality of second photodiodes and a plurality of third photodiodes, wherein the plurality of pixels are configured to receive incoming light through an illuminated surface of the semiconductor material;
a plurality of small microlenses individually distributed over individual first photodiodes and individual second photodiodes of each subpixel; and
a plurality of large microlenses each distributed over a plurality of third photodiodes of each subpixel;
wherein:
a diameter of the small microlenses is smaller than a diameter of the large microlenses,
centrally-located pixels carry the small microlenses and the large microlenses that are centered with respect to their corresponding photodiodes and subpixels,
peripherally-located pixels carry the small microlenses and the large microlenses that are offset toward a center of the pixel array with respect to their corresponding photodiodes and subpixels,
an offsetting is proportional to a distance from the center of the pixel array to a centerline of respective subpixels,
each of the plurality of large microlenses individually distributed over individual third photodiodes of each subpixel is offset a same first offset value, and each of the plurality of small microlenses individually distributed over individual first photodiodes and individual second photodiodes of each subpixel is offset a same second offset value for each first and second photodiodes of the subpixel.

2. The image sensor of claim 1, wherein each pixel comprises 1 red (R) subpixel, 1 blue (B) subpixel, and 2 green (G) subpixels.

3. The image sensor of claim 2, wherein each G subpixel comprises one plurality of third photodiodes.

4. The image sensor of claim 1, wherein the first photodiodes are blue (B) photodiodes and the second photodiodes are red (R) photodiodes.

5. The image sensor of claim 4, wherein the third photodiodes are green (G) photodiodes.

6. The image sensor of claim 4, wherein each pixel includes 4 subpixels, and each subpixel includes 4 photodiodes.

7. The image sensor of claim 1, wherein the offsetting of the small microlenses and large microlenses proceeds linearly from the center of the pixel array to a periphery of the pixel array.

8. The image sensor of claim 1, wherein the offsetting of the small microlenses and large microlenses proceeds non-linearly from the center of the pixel array to a periphery of the pixel array.

9. An image sensor, comprising:
a plurality of pixels arranged in rows and columns of a pixel array disposed in a semiconductor material, wherein each pixel comprises a plurality of subpixels and each subpixel comprises a plurality of photodiodes, wherein the plurality of pixels are configured to receive incoming light through an illuminated surface of the semiconductor material; and
a plurality of microlenses comprising small microlenses each configured over individual photodiodes and large microlenses each configured over individual subpixels of the pixel array,
wherein a diameter of the small microlenses is smaller than a diameter of the large microlenses,
wherein centrally-located pixels carry the small microlenses and the large microlenses that are centered with respect to their individual photodiodes and subpixels, and
wherein peripherally-located pixels carry the small microlenses and the large microlenses that are offset toward a center of the pixel array with respect to their individual photodiodes and subpixels, and
an offsetting is proportional to a distance from the center of the pixel array to a centerline of respective subpixels,
each of the plurality of large microlenses individually distributed over individual third photodiodes of each subpixel is offset a same first offset value, and
each of the plurality of small microlenses individually distributed over individual first photodiodes and individual second photodiodes of each subpixel is offset a same second offset value for each first and second photodiodes of the subpixel.

10. The image sensor of claim 9, wherein the offsetting of the plurality of microlenses proceeds linearly from the center of the pixel array to a periphery of the pixel array.

11. The image sensor of claim 9, wherein the offsetting of the plurality of microlenses proceeds non-linearly from the center of the pixel array to a periphery of the pixel array.

12. The image sensor of claim 9, wherein the plurality of photodiodes of each pixel comprises a plurality of first photodiodes, a plurality of second photodiodes and a plurality of third photodiodes, wherein the small microlenses are individually distributed over individual first photodiodes and individual second photodiodes of each subpixel, wherein the large microlenses are individually distributed over the plurality of third photodiodes of each subpixel.

13. The image sensor of claim 12, wherein the first photodiodes are blue (B) photodiodes and the second photodiodes are red (R) photodiodes.

14. The image sensor of claim 13, wherein the third photodiodes are green (G) photodiodes.

15. The image sensor of claim 12, wherein each pixel includes 4 subpixels, and each subpixel includes 4 photodiodes.

16. An image sensor, comprising:

a plurality of pixels arranged in rows and columns of a pixel array disposed in a semiconductor material, wherein each pixel comprises a plurality of subpixels and each subpixel comprises a plurality of first photodiodes, a plurality of second photodiodes and a plurality of third photodiodes, wherein the plurality of pixels are configured to receive incoming light through an illuminated surface of the semiconductor material;

a plurality of small microlenses individually distributed over individual first photodiodes and individual second photodiodes of each subpixel; and a plurality of large microlenses each distributed over a plurality of third photodiodes of each subpixel;

wherein a diameter of the small microlenses is smaller than a diameter of the large microlenses, wherein centrally-located pixels carry small microlenses and large microlenses that are centered with respect to their corresponding photodiodes and subpixels, wherein peripherally-located pixels carry small microlenses and large microlenses that are offset toward a center of the pixel array with respect to their corresponding photodiodes and subpixels, wherein an offsetting is proportional to a distance from the center of the pixel array to a centerline of respective subpixels, each of the plurality of large microlenses individually distributed over individual third photodiodes of each subpixel is offset a same first offset value, and each of the plurality of small microlenses individually distributed over individual first photodiodes and individual second photodiodes of each subpixel is offset a same second offset value for each first and second photodiodes of the subpixel.

17. The image sensor of claim 16, wherein the first photodiodes are blue (B) photodiodes, the second photodiodes are red (R) photodiodes, and the third photodiodes are green (G) photodiodes.

18. The image sensor of claim 16, wherein the offsetting of the small microlenses and the large microlenses proceeds linearly from the center of the pixel array to a periphery of the pixel array.

19. The image sensor of claim 16, wherein the offsetting of the small microlenses and the large microlenses proceeds non-linearly from the center of the pixel array to a periphery of the pixel array.

* * * * *